United States Patent
Goetz et al.

(10) Patent No.: US 6,436,735 B1
(45) Date of Patent: Aug. 20, 2002

(54) METHOD FOR MOUNTING AN INTEGRATED CIRCUIT HAVING REDUCED THERMAL STRESSES BETWEEN A BOND PAD AND A METALLIC CONTACT

(75) Inventors: Martin P. Goetz, Discovery Bay; Sammy K. Brown, Los Gatos; George E. Avery, Saratoga; Andrew K. Wiggin, San Carlos; Tom L. Todd, San Jose; Sam Beal, Mountain View, all of CA (US)

(73) Assignee: Alpine Microsystems, Inc., Campbell, CA (US)

( * ) Notice: Subject to any disclaimer, the term of this patent is extended or adjusted under 35 U.S.C. 154(b) by 0 days.

(21) Appl. No.: 09/630,247

(22) Filed: Jul. 31, 2000

Related U.S. Application Data (62) Division of application No. 09/083,631, filed on May 22, 1998, now Pat. No. 6,175,161.
(60) Provisional application No. 60/047,531, filed on May 23, 1997.

(51) Int. Cl.$^7$ .............................................. H01L 21/44
(52) U.S. Cl. .................. 438/125; 438/612; 257/701
(58) Field of Search ................................ 438/125, 108, 438/612; 257/701

(56) References Cited

U.S. PATENT DOCUMENTS

| 4,888,665 A | * | 12/1989 | Smith |
| 5,148,266 A | * | 9/1992 | Khandros et al. |
| 5,371,403 A | * | 12/1994 | Huang et al. |
| 5,457,340 A | * | 10/1995 | Templeton, Jr. et al. |
| 5,483,100 A | * | 1/1996 | Marrs et al. |
| 5,541,450 A | * | 7/1996 | Jones et al. |
| 5,557,502 A | * | 9/1996 | Banerjee et al. |
| 5,628,919 A | * | 5/1997 | Tomura et al. |
| 5,708,296 A | * | 1/1998 | Bhansali |
| 5,883,428 A | * | 3/1999 | Kabumoto et al. |

OTHER PUBLICATIONS

Todd Takken and David Tuckerman, "Integral Decoupling Capacitance Reduces Multichip Module Ground Bounce," Proceedings of 1993 IEEE Multi–Chip Module Conference, pp. 79–84, Jan. 1993.*

* cited by examiner

Primary Examiner—Keith Christianson
Assistant Examiner—Stephen W. Smoot
(74) Attorney, Agent, or Firm—Kenneth C. Brooks (57) ABSTRACT

A system and method for efficiently interconnecting a plurality of ICs, thereby improving the electrical performance of the overall system while reducing contact degradation due to stress that results from differences in the coefficients of thermal expansion of the various components during thermal cycling

20 Claims, 9 Drawing Sheets

METHOD FOR MOUNTING AN INTEGRATED CIRCUIT HAVING REDUCED THERMAL STRESSES BETWEEN A BOND PAD AND A METALLIC CONTACT

CROSS REFERENCE TO RELATED APPLICATIONS

This application is a divisional patent application of U.S. patent application Ser. No. 09/083,631 filed on May 22, 1998, now U.S. Pat. No. 6,175,161, which claims priority to U.S. provisional patent application "A SYSTEM AND METHOD FOR PACKAGING INTEGRATED CIRCUITS," U.S. Ser. No. 60/047,531, filed May 23, 1997, having Sammy K. Brown, George E. Avery, Andrew K. Wiggin, Tom L. Todd and Sam Beal listed as co-inventors and assigned to Alpine Microsystems. The No. 60/047,531 application is hereby incorporated by reference in its entirety.

BACKGROUND OF THE INVENTION

The present invention relates to the packaging of semiconductor devices, and more particularly to a system and method for interconnecting integrated circuits (ICs) on a semiconductor substrate.

Electronic systems typically are manufactured from two or more ICs to provide complete system function. Until recently the limitations on performance and number of I/O pins were not significant for the vast majority of applications. However, as more devices are integrated in a single IC and as clock speeds increase, limitations on performance and number of I/O pins would be of paramount concern to semiconductor manufacturers. This is because the overall performance of the system is based on multiple ICs is a function of the performance of the individual ICs and of the performance of the signals between the ICs. The performance of the signals between the ICs is in turn a function of the number of signals and the electrical characteristics of the means used to connect the I/O pins of the ICs. A more efficient means for interconnecting ICs is, therefore, becoming an important influence on the cost, size, performance, weight, and efficiency of electronic systems.

Currently, the most common method used for interconnecting ICs is to first package the individual ICs, and then mount the packaged ICs on a substrate such as a printed circuit board. The size of the package is typically several times larger than the IC and is often manufactured from a metal lead frame and protected within a plastic molded case. The packaged ICs are then placed and soldered to a printed circuit board to create a complete electronic system. The advantages of the current method include low cost and protection of the IC during subsequent handling. In addition, the package acts as a standardized carrier for testing of the IC, such that design changes to the printed circuit board may be made cheaply and quickly. Assembly of the IC to the printed circuit board may further be automated. Finally, the current system allows rework of the printed circuit.

A more efficient method of interconnecting ICs has been demonstrated with the use of flip-chip technology in which a silicon substrate having metallization is connected to an integrated circuit via solder connections. This type of coupling between the integrated circuit and the substrate allows increasing the number of I/O pins, compared to other interconnect technology. A drawback with traditional flip-chip technologies concerns the degradation of the electrical connections subsequent to repeated thermal cycling.

What is needed, therefore, is a mounting technique for integrated circuits that facilitates increased I/Os while avoiding thermal degradation of the I/O substrate interface.

SUMMARY OF THE INVENTION

Provided is a mount for an integrated circuit and a process for manufacturing the same that features a routing carrier having a power plane, a conductive bond pad spaced-apart from the power plane and an insulative body disposed therebetween. The insulative body includes a via extending between the power plane and the conductive bond pad with a metallic contact disposed therein. The metallic contact and the bond pad have circular cross-sections, with a ratio of the diameter of the bond pad to the diameter of the metallic contact being in the range from 2:1 to 5:4, inclusive, i.e, the solder pad would be anywhere from 125% to 200% larger than the via diameter. The present invention is based upon the discovery that degradation of the electrical connection between the routing carrier and an integrated circuit mounted thereto results from cracking of the metallic contact. To solve this problem the relative size of the bond pad to metallic contact was found to be critical. Specifically, it was determined critical that the diameter of the bond pad and the diameter of the metallic contact have the aforementioned ratio. With this structure, the stress to which the metallic contact is subjected to by the solder bump is controlled when disposing the solder bump on the bond pad employing electroplating techniques, because it allows controlling the size of the solder bump on the bond pad. When disposing the solder bump using electroplating techniques, the solder bump takes a hemispherical shape. A sufficient amount of solder is provided so that the diameter of the solder bump is approximately equal to the diameter of the bond pad.

One embodiment of the present invention is described as being used in conjunction with a plurality of routing carriers formed from silicon, each of which has an IC attached thereto. A semiconductor board, typically formed from silicon has a plurality of signal traces and a plurality of bond sites disposed thereon, with the plurality of bond sites enclosing a region of the insulative member. A subset of the plurality of signal traces are associated with the plurality of bond sites so that each of the signal traces of the subset extends from one of the plurality of bond sites, away from the region, defining an electrically nonconductive area. The conductive bond pads on the routing carriers superimposes the subset of bond sites enclosing the region so that each of the subset of bond pads superimposes one of the subset of bond sites, when placed in a final seating position. The routing carrier includes a plurality of conductive traces, a subgroup of which superimposes the nonconductive area and extends between a pair of bond pads so as to place a pair of the bond sites in electrical communication. The integrated circuit is coupled to a subset of the remaining bond pads of the routing carrier and is positioned thereon so as to superimpose the nonconductive area. The nonconductive area typically comprises an aperture having an area which exceeds a cross-sectional area of the integrated circuit, with the integrated circuit being positioned on the routing carrier so as to fit within the aperture, upon the routing carrier reaching a final seating position with the board.

These and other embodiments of the present invention, along with many of its advantages and features, are described in more detail in the text below and the attached figures. In the figures, like reference numerals indicate identical or functionally similar elements.

DESCRIPTION OF THE PREFERRED EMBODIMENT

The present invention provides a system and a method for efficient interconnection of ICs to form a complex electronic component with improved overall system performance.

Figure 1:
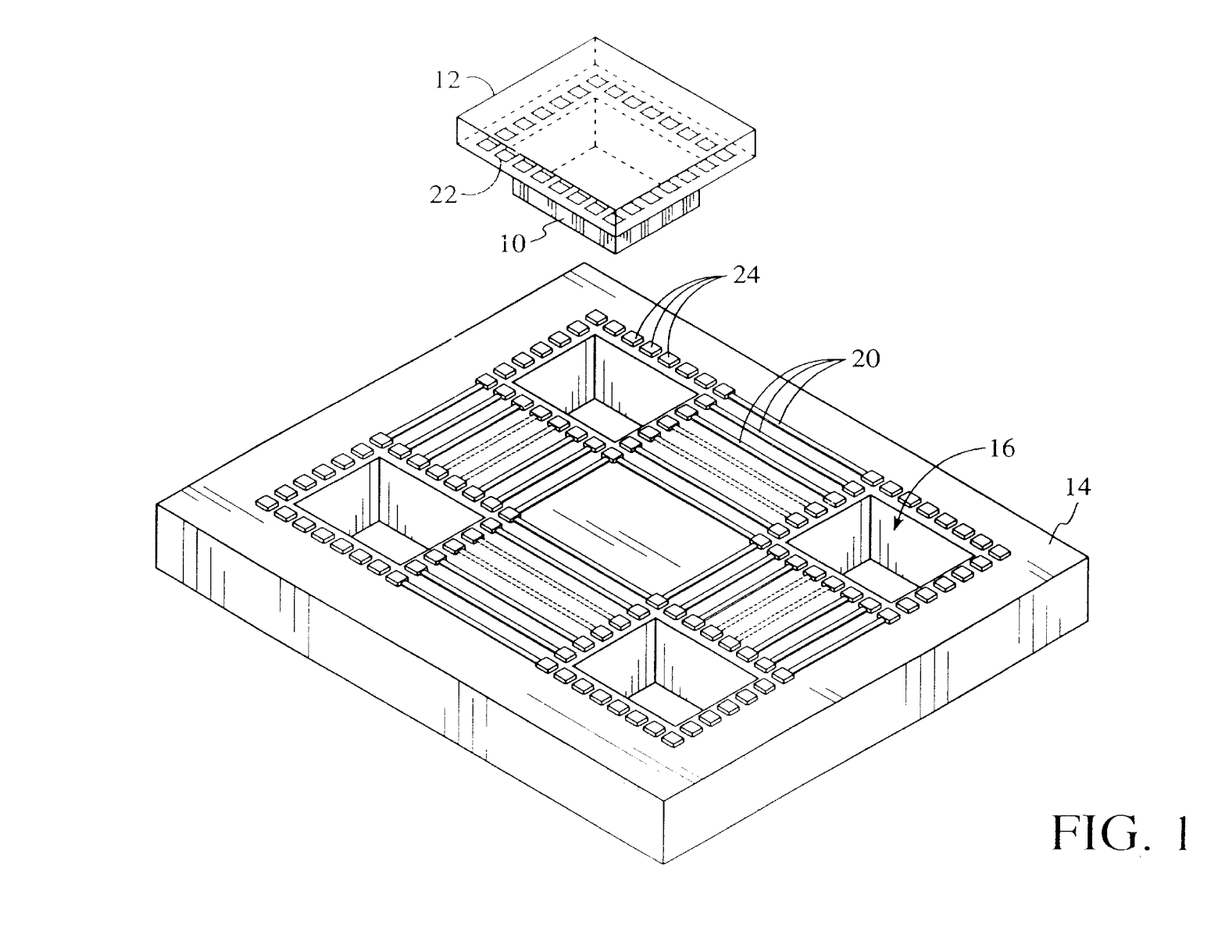
FIG. 1 shows an exploded view of the different components for efficient interconnection of ICs according to the system of the present invention.

FIG. 1 shows an exploded view of an integrated circuit (IC) 10 mounted to a carrier 12, and a board 14 with a plurality of openings 16. As shown, board 14 has four openings 16, however, the number of openings 16 changes according to the number of carriers to be connected to board 14. Similarly, though openings 16 are shown to be of equal sizes, they may differ in size in another example as the sizes of the openings are determined by the sizes of the ICs to be electrically connected to board 14. In the example as shown in FIG. 1, carrier 12 is connected to IC 10 only. However, as later discussed, carrier 12 may be connected to more than one IC or to other electronic components. If carrier 12 is connected to only one IC, the number of carriers for the system will depend on the number of ICs in the complex IC. In a preferred embodiment, the sizes of the carriers correspond to the sizes of the ICs in the complex IC, and the size of the board corresponds to the size of the complex IC.

Carrier 12 is preferably thermally compatible with board 14 and IC 10, since carrier 12 connects IC 10 and board 14. Thermal expansion compensation between IC 10, carrier 12, and board 14 may be accomplished by the use of compliant materials such as wires to make connections between the IC and the package. Alternatively, bonding materials may be used to limit the stresses. The preferred method, however, is to have carrier 12 and board 14 be made of materials with similar Coefficient of Thermal Expansion (CTE) as IC 10. In a preferred embodiment, carrier 12 and board 14 are made of the same material as IC 10. Since ICs are typically manufactured from single crystal silicon, which has a relatively low CTE, silicon is the preferred carrier and board material. However, gallium arsenide or other materials with comparable CTE may also be utilized.

FIG. 1 also shows the interconnections on board 14. Board 14 is manufactured employing semiconductor photo lithographic processes; hence, the routing density of board interconnections 20 on board 14 is higher than that for conventional board level interconnect. Connections 22 on carrier 12 are pre-manufactured to fit the bond pad pattern of connections 24 on board 14. Board 14, therefore, serves both as a mechanical base and implements at least a single layer of routing through interconnections 20 between neighboring carriers and ICs. There are preferably no vias in board 14 as the IC interconnections are preferably distributed among the carriers by allowing signals between the ICs to be passed through neighboring chips. Since all subsystem routing is preferably distributed across the individual carriers, the complexity of the board routing is reduced to single node sets. Compared to a single interconnection board, interconnection distributions among the carriers greatly simplify the interconnection task, and significantly improve the overall system performance. Although board 14 preferably has only one level of interconnect, in applications where yield is not critical, board 14 could have multiple levels of 10 interconnect. In such applications, there would be vias in board 14 as the interconnections would include pass-throughs as well as crossovers.

Figure 2A:
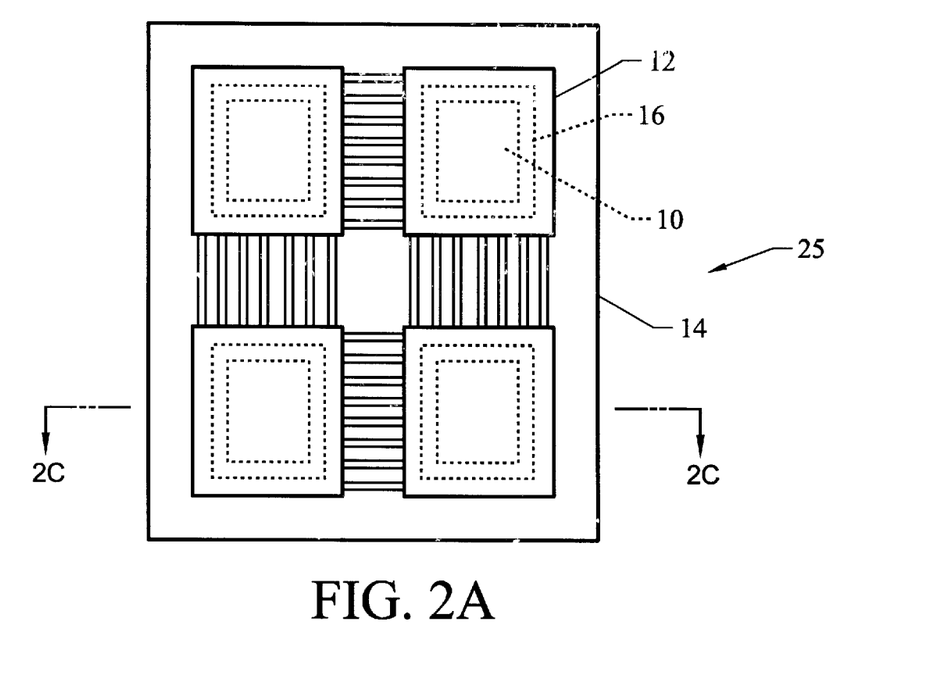
FIGS. 2A–2C show a top view of the IC/carrier subassembly on the board, a side view of the IC/carrier subassembly, and a side view of the IC/carrier subassembly on the board, respectively.
Figure 2B:
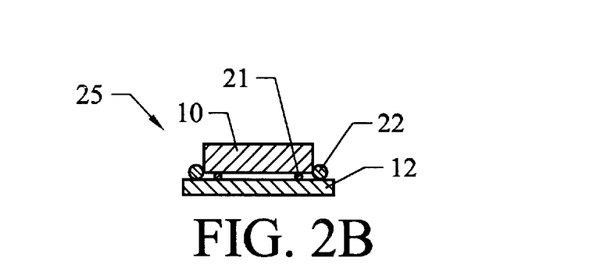
Figure 2C:
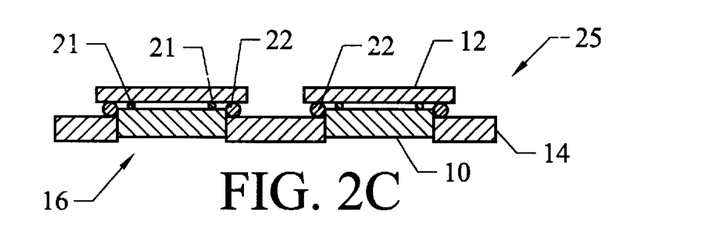

FIGS. 2A–2C show a top view of an IC/carrier subassembly 25 on board 14, a side view of IC/carrier subassembly 25, and a side view of IC/carrier subassembly 25 on board 14, respectively. As shown in FIG. 2B, subassembly 25 consists of IC 10 mounted to carrier 12. Carrier 12 is pre-manufactured with solder bumps (shown as connections 21 and 22) which are placed in arrays aligned to mirror the bond pad patterns of IC 10 and board 14, respectively. IC 10 is flip chip bonded to carrier 12 through connections 21. As shown in FIG. 2C, each subassembly 25 is mounted to board 14 so that IC 10 will fit within opening 16. As can be seen, carrier 12 extends around opening 16 and connects to board 14 through connections 22. Typically, the number of connections 21 between IC 10 and carrier 12 will not be equal to the number of connections 22 between carrier 12 and board 14.

The use of opening 16 enables all of the signal connections to lie in a plane formed by the top side of IC 10, the top side of carrier 12, and the top side of board 14. This configuration is very advantageous, as the chemical properties of silicon are such that it is impractical to form plated vias through silicon materials thicker than a few tenth of a micron. By using the same materials for carrier 12 and board 14, direct solder connections may be made between carrier 12 and board 14. Since IC 10 and carrier 12 are preferably made of the same materials, signal connections may also be directly soldered on the carrier and connected to the IC. As previously discussed, the solder bumps on carrier 12 are aligned to mirror IC 10's bond pad pattern. Hence, IC 10 need not be solder bumped.

The advantage of using solder bumps to connect the IC to the carrier, and the carrier to the board is that an area array may be used to maximize the number of external signal connections available. In addition, parasitics associated with wire bonding may be eliminated. Solder bump flip chip bonding is an automated process, and bumping cost does not increase with pin count. Hence, the use of solder bumps also enables integration of higher I/O pin counts while keeping cost low.

Figure 3:
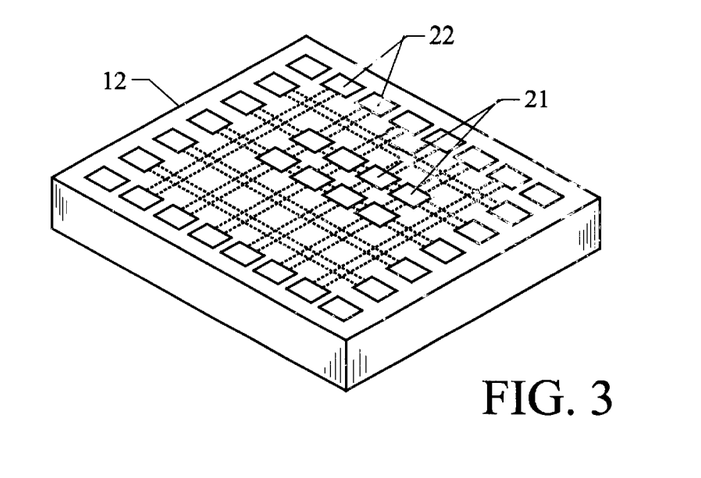
FIG. 3 shows an example set of electrical interconnections on a carrier.

FIG. 3 shows an exemplary electrical interconnection configuration on carrier 12. For simplicity, a relatively small number of connections are shown. As can be seen, carrier 12 has connections 22 along its peripherals and connections 21 around its central portion. Connections 21 and 22 connect IC 10 to carrier 12, and carrier 12 to board 14, respectively. Connections 21 may be routed to connections 22 using embedded interconnects, and such routing may have at least one crossover. These crossovers allow signals to be passed to and from the IC on carrier 12. In addition, the signal paths on carrier 12 may be independent of the IC routing. These independent signal paths serve as pass throughs for signals from a neighbor IC to other neighboring ICs. In this manner, interconnection of the ICs are distributed across the individual carriers.

Connections 21 and 22 are predetermined according to the application of the particular complex ICs. Since connections 21 and 22 are manufactured using semiconductor photolithography techniques, the resulting routing density is very similar to the density of on-chip interconnect. Specifically, connections 21 and 22 are made through inner and outer rows of solder bumps, deposited in patterns to match the bond pads of the IC 10 and the board 14. This eliminates the need to place solder bumps on individual ICs. The number of connections between ICs, known as external interconnect, generally requires significantly less interconnect density than the interconnect density used to connect transistors on the IC. Hence, the external interconnection density can always be made high enough by using the same or less advanced semiconductor process that is used to fabricate the IC itself. Using this same technique, the external interconnections may also be made to fit into an area that is the same or less than the area of the IC itself. This provides a significant yield advantage over the current method as the size and area of printed circuit boards are generally many times larger than the ICs themselves.

Figure 4:
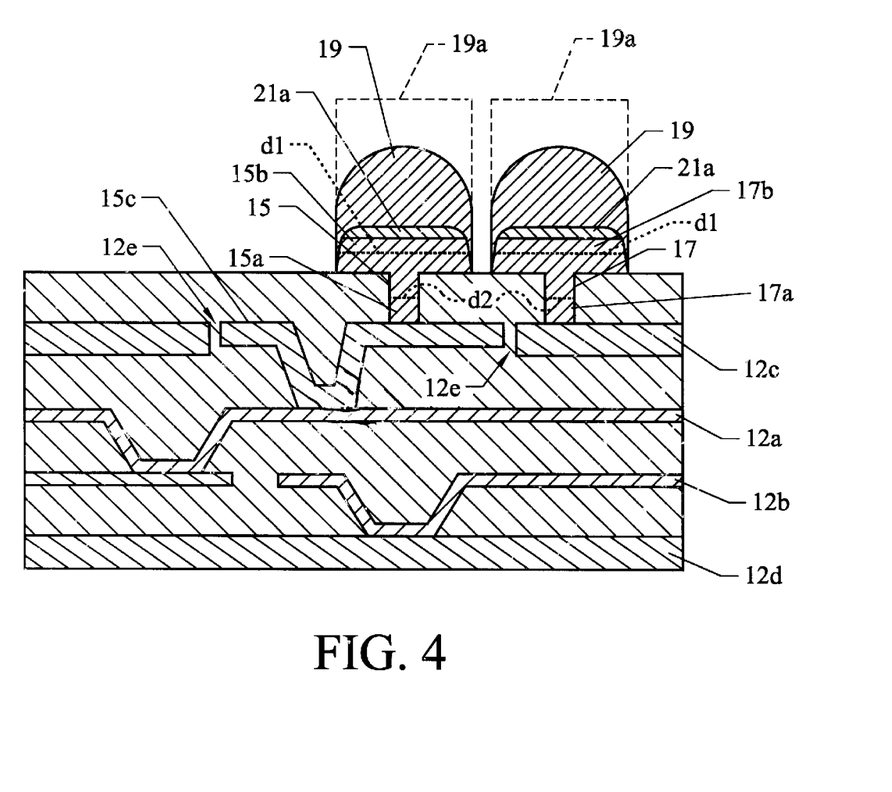
FIG. 4 is cross sectional view of the carrier shown above in FIG. 3.

Referring to both FIGS. 3 and 4, carrier 12 is manufactured from a multi-level semiconductor metallization process. Electrical connections to the signal paths and to the power planes are achieved through the use of vias, shown as 15 and 17, respectfully. In each via, a metallic contact disposed therein extends from a bond pad to a conductive layer. With respect to via 15, metallic contact 15a is disposed therein that extends from conductive bond pad 15b to signal trace 15c which is in electrical communication with signal layers 12a. Metallic contact 17b is disposed in via 17 and extends from conductive bond pad 17b to power plane 12c. Typically all the vias are in the same layer, allowing custom changes to connections 21 and 22 to be easily made at the manufacturing level by single-mask programming. For each new application, the location of the vias may be determined according to the particular IC interconnections desired. Once the locations of the vias have been determined, only the via-containing layer needs to be changed.

The carrier 12 contains a multiple level interconnection matrix with at least 800 signal paths /cm2. The configuration of the interconnection matrix is mask programmable and facilitates high-speed data signal propagation in excess of 20 GHz. The input and output (I/O) signals of the IC 10 can be routed to multiple sides thereof the die, effectively tripling the I/O density of the IC 10. The carrier 12 interconnection matrix is composed of two signal layers 12a and 12b sandwiched between reference planes for power 12c and ground 12d. Each layer is five micrometers of electroplated copper. The power layer 12c provides a reference plane for $V_{dd}$ and includes a hiatus 12e in which a bond pad connection is disposed. By surrounding the two spaced-apart signal paths 12a and 12b between two power planes 12c and 12d, the noise, such as crosstalk and simultaneous switching noise (SSN), in the signal paths 12a and 12b is reduced.

Crosstalk results from mutual capacitance between two adjacent signal lines. For the carrier 12, the resulting crosstalk noise can be estimated as follows:

$$V_{cn} = 0.176 \times 10^{-9} (V_{in}/t_{rise})$$

where $V_{in}$=input voltage. Far end crosstalk tends to cancel and can be neglected. SSN created in the $V_{DD}/V_{SS}$ loops formed by the output buffer's discharge path is frequently called ground bounce since it is superimposed on the local ground plane 12d (applies to the power plane 12c, as well). The magnitude of the noise voltage can be approximated as follows:

$$V_{ssn} = L_{eff} \, dI/dt$$

where $L_{eff}$ is the effective self inductance of the die to package to ground connections. The equation tends to overestimate $V_{ssn}$ by neglecting negative feedback effects dI/dT. The circuit noise margins must be sufficient to guarantee proper operation in the presence of SSN. The flip-chip attachment process used for the carrier 12 and the board 14 assembly offers extremely low (<0.1 nH) parasitic inductance, and the carrier 12 contains non-perforated reference planes.

By surrounding the two spaced-apart signal paths 12a and 12b between two power planes 12c and 12d, the distance between each of the power planes 12c and 12d and the signal paths 12a 12b may be easily controlled so as to be constant over the volume of the carrier. This facilitates formation of a constant impedance between power plane 12c and signal path 12a, as well as power plane 12d and signal path 12b. In addition, the crosstalk is avoided by placing signal path 12a proximate to power plane 12c and signal path 12b proximate to power plane 12d. In this fashion, the return path for the current in the signal propagating along one of the paths 12a or 12b is not the signal path adjacent thereto, but rather the power plane 12c or 12d.

Noise may be further reduced by abrogating reflection noise, which is caused by an impedance mismatch between a driver and receiver. Reflection noise becomes problematic when the time of flight of a signal is comparable with the signal's rise time. Consequently, very short connections that satisfy the following constraint will minimize reflection noise problems.

$$t_{flight} < t_{rise}/4$$

For a typical carrier 12 signal interconnect, the time of flight is:

$$t_{flight} \sim 50 \text{ pS.}$$

Hence, by keeping rise and fall times >200 ps, reflection noise and the resulting impact on settling time can be avoided. For 3.3V transitions, this translates into an interconnect load capacitance of <66 pF per interconnect. In this fashion, the carrier 12 provides a highdensity routing structure with low noise by which to interconnect various pads of a single IC 10, or multiple ICs 10.

The board 14, on the other hand, serves as a mechanical base for the carrier 12 while providing single-layer routing between adjacent carriers 12. The combination of multilayer carrier 12 interconnection matrix and the single-layer signal path of the board 14 interconnect effectively produces a continuous connect X Y interconnect plane over the multi-chip subsystem. Carriers 12 that do not have direct connections to a board 14 adjacent thereto share a power plane 12c or 12d with another carrier 12. Although it is not necessary, it is preferred that carriers and/or ICs 10 that are to be in data communication, i.e., electrically coupled, should be positioned proximate to each other.

In addition to providing adequate current-carrying paths for the total peak requirements of the individual IC 10, the carrier 12 and board 14 combination must provide sufficient power dissipation to satisfy the estimated power consumption of the device. In an effort to improve the power characteristics of the carrier 12 board 14 combination, it is preferred that the IC 10 employ low-swing signal techniques.

Figure 5A:
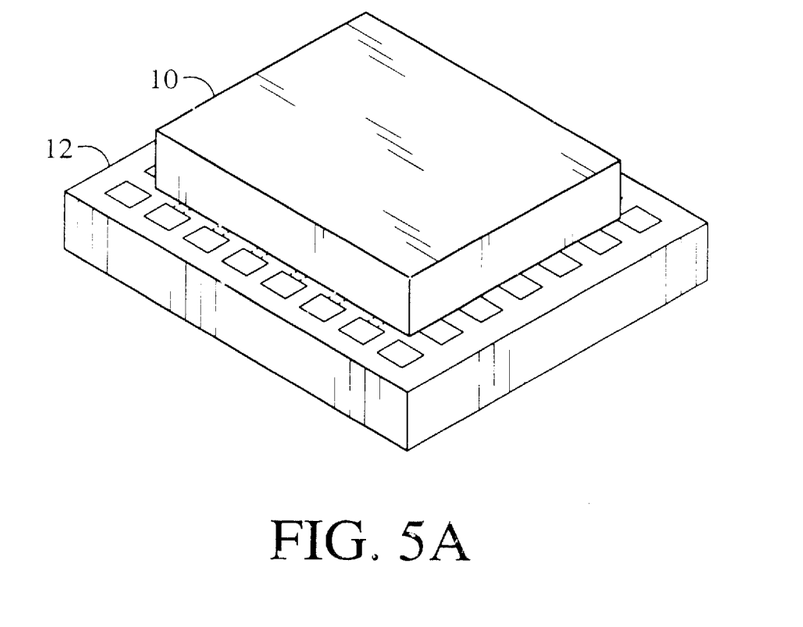
FIGS. 5A–5B show a single IC mounted on a carrier, and multiple ICs mounted on a carrier, respectively.
Figure 5B:
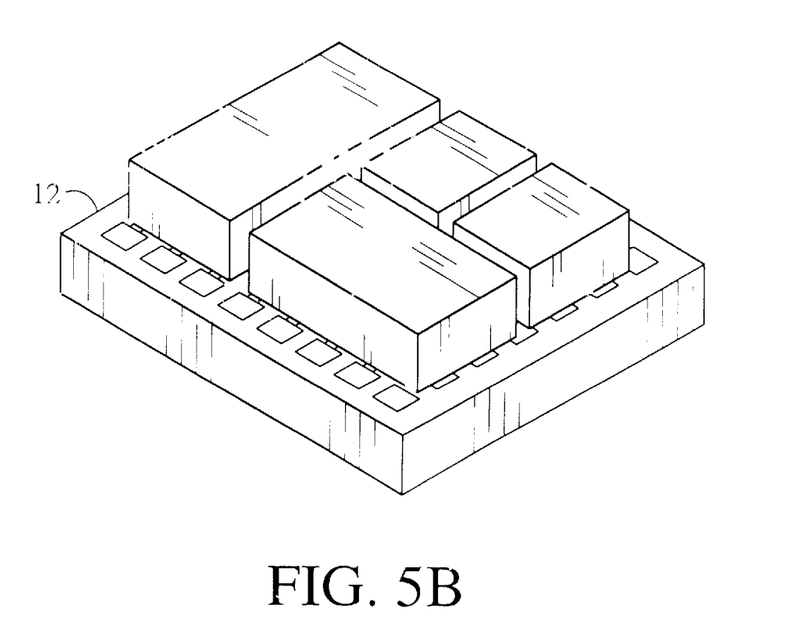

Referring to FIGS. 4, 5A and 5B, one or more ICs 10 may be mounted on carrier 12, along with other electrical components (not shown) such as resistors and capacitors. Hence, carrier 12 functions as a multi-chip module within itself. This is very advantageous as more components may be interconnected on board 14. Moreover, with carrier 12 as an intermediate board, the interconnections are comparable to on-chip interconnects. To facilitate coupling of the IC 10 on the carrier 12, solder bumps 19 are mounted atop of the bond pads 15b and 17b. As the metallic contacts 15 and 17 and the bond pads 15b and 17b are typically formed from copper, a layer 21a of nickel and gold may be disposed between the solder bump 19 and the bond pad to facilitate adhesion of the solder bump 19 to the bond pads 15b and 17b.

A problem encountered concerned the degradation of the electrical contact between the bond pad 15b and 17b and the underlying layer to which it is attached. Specifically, after repeated temperature cycling it was discovered that the that degradation of electrical contact between the bond pad 15b and 17b and the underlying conductive trace results from cracking of the metallic contact 15a and 17a associated therewith. It was determined that this problem arose from the difference in coefficients of thermal expansion of the bond pads, the solder bump and the silicon dielectric which surrounds the metallic contact. The solution to this problem was based upon a finding of the criticalness of the relative sizes of the bond pad to metallic contact. The area of the bond pad to the area of the metallic contact had to have a ratio within a specified range. Provided that the metallic contact and the bond pad have circular cross-sections, the ratio of the diameter of the bond pad d, to the diameter of the metallic contact $d_2$, had to be in the range from 2:1 to 5:4, inclusive. With this structure, the stress to which the metallic contact is subjected to by the solder bump when cycling over temperature, is controlled when disposing the solder bump on the bond pad employing electroplating techniques, because it allows controlling the size of the solder bump on the bond pad.

Typically, the solder bump is formed using electroplating techniques resulting in molten solder covering the area of the bond pad and taking on a hemispherical shape. When attaching the solder to the bond pad a cubical shape of solder, shown by dashed-line 19a is applied. Thereafter, the solder cube 19a is heated allowing it to reflow and take on the aforementioned hemispherical shape. A sufficient amount of solder is provided in the cube 19a so that the diameter of the solder bump 19 is approximately equal to the diameter of the bond pad after the electroplating process. By providing the solder bump 19 with a diameter in the aforementioned range stresses on the metallic contacts 15a and 17a due, to thermal cycling, are reduced.

Figure 6:
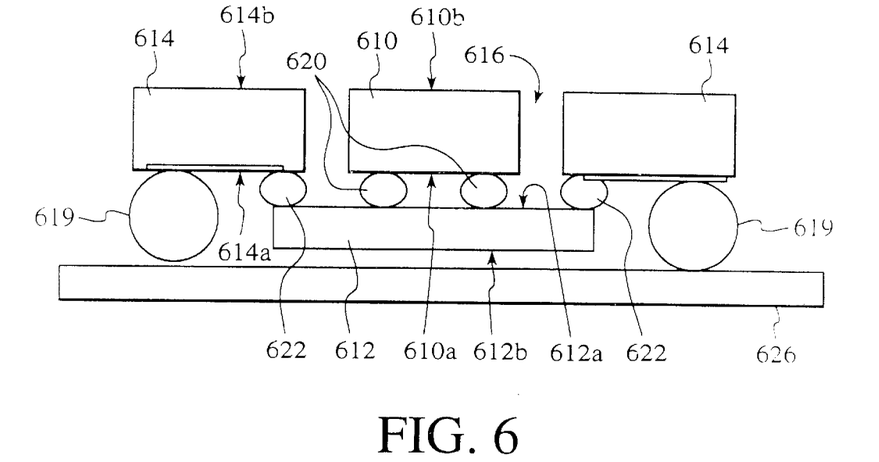
FIG. 6 is a side view of the IC-carrier-board subassembly mounted to a printed circuit board.

Referring to FIG. 6 an advantage with overcoming the aforementioned problem is that it facilitates coupling of the board 614 and routing carrier 612 to a printed circuit board 626 without wirebond connections. Specifically, considering that the aforementioned ratio of the diameter of the solder ball to the diameter of the metallic contact is within the aforementioned range, degradation of solder bond contacts resulting from differences in the coefficients of thermal expansion between a printed circuit board 626 and the solder balls 619 coupled thereto is avoided. In this fashion, the IC 610, is shown having a mounting surface 610a and a major surface 610b, disposed opposite to the mounting surface 610a, may be attached so that the mounting surface 610a is coupled to a mounting surface 612a of the carrier 612 employing solder bumps 620, as discussed above. The board 614 includes a mounting surface 614a and a major surface 614b, disposed opposite thereto, with the carrier 612 being mounted to the mounting surface 614a employing solder bumps 622, as discussed above, so that the IC 610 is disposed within the aperture 616. Preferably, the relative dimensions of solder bumps 620 and 622 are chosen so that the major surface 610b is coplanar with major surface 614b, i.e., 325 to 40 microns in diameter after reflow. This board 614-routing carrier 612 subassembly is then mounted to a package substrate, such as a printed circuit board 626, using solder balls 619, with the carrier 612 disposed between the board 614 and the printed circuit board 626. Although it is not necessary, the solder balls 619 are of sufficient size to space the carrier 612 from the printed circuit board 626, i.e., and are in the range 650 to 750 microns after reflow.

Figure 7:
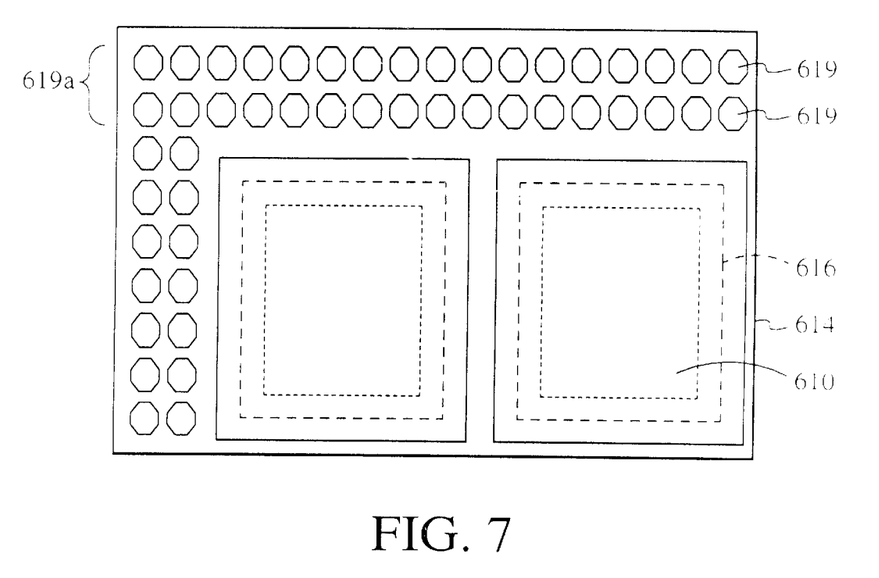
FIG. 7 is a top down view of an IC-carrier-board assembly in accordance with an alternate embodiment of the present invention.

Referring to FIGS. 6 and 7, to facilitate attaching the board 614 to a printed circuit board 626, an array 619a of solder balls 619 may be formed thereon. This may be accomplished by increasing the area of the board 614 about carrier 612, and routing signal paths (not shown) to the array 619a. In this fashion, one level of packaging is eliminated by allowing direct attach of the board 614 and carrier 612 subassembly to a printed circuit board 626, thereby reducing manufacturing costs for a given system. Additionally, the electrical performance of such a system may be enhanced by abrogating the need for wirebonding, depending on such factors as material type, diameter and length of the wirebonds used for interconnecting the IC to the package. The electrical parasitics associated with the wirebonds can restrict the IC 610 performance. By having all electrical connections achieved through solder balls, the aforementioned electrical parasitics may be reduced, if not avoided.

The process for fabricating the carrier 12 using a batch process includes: conventional chemical vapor deposition techniques. In one example a wafer is prepared for processing by removing native oxide therefrom. Thereafter, the wafer surface is nucleated with a layer of copper approximately 4,000 angstroms thick. The copper layer is deposited to have a substantially even thickness over the surface of the wafer. A layer of photo resist is deposited over the nucleations layer to a thickness in the range of 8 to 10 microns. The layer of photo resist is used as a plating barrier to form the power planes 12a and 12b, shown above in FIG. 4. The power planes 12a and 12b are defined by a mask layer which is deposited atop of the photo resist. Thereafter, a photo resist anisotropic etch step removes the photo resist from the regions defined by the mask, exposing the nucleation layer. A layer of copper 5.0 microns thick is disposed in the regions removed by the aforementioned etch step using electroplating techniques. Specifically, the periphery of the wafer is attached to a plating electrode to allow contact between the electrode and the nucleation layer. The wafer is then immersed in a copper electroplating bath where approximately 5 microns of copper are plated into the aforementioned regions. After completion of the electroplating step, the photo resist is removed leaving the patterned power planes 12a and 12b. The copper nucleation layer remains shorting all metal patterns present on the wafer.

A blanket wet etch is then performed to remove the copper nucleation layer and provide electrical isolation between power planes 12a and 12b. An adhesion promoter, 3-Aminopropyltriethoxysilane (3-APS), 0.5% in methanol, is disposed on the wafer. The 3-APS solution is dynamically dispensed onto the center of the wafer while the wafer spins at 3000 rpm. The spin speed is then increased to 5000 rpm for 30 seconds to dry the surface. Thereafter, a dielectric layer of BCB is deposited. The dielectric layer has a thickness of approximately 5.0 microns and electrically insulates power planes 12a and 12b, forming a microstrip transmission line structure. The 3-APS enhances the adhesion of BCB to copper.

A second mask is disposed atop of the dielectric layer to position and define vias, which are subsequently etched during a Photo-BCB develop process. This is followed by the sputtering of a 4,000 angstrom thick TiCu which covers the entire wafer. The TiCu layer functions as a plating electrode for a subsequent copper electroplating step. The electrode attachment is on the outer edge of the wafer. A second layer of photo resist approximately 8 to 10 microns thick is deposited. The second photo resist is used as a plating barrier to form one of the signal layers 12c and 12d, which is defined by a mask. The photo resist is then anisotropically etched, exposing the TiCu layer in various regions of the photo resist. Copper, up to five microns thick is deposited in the aforementioned vias, as well as the regions exposed during the anisotropic etch using an electroplating technique. The photo resist is then removed leaving the signal paths 12c and 12d formed by an additive process. A blanket wet etch is now performed to remove the TiCu layer and provide electrical isolation between signal layers 12c and 12d. Another layer of 3-APS adhesion promoter and BCB is then deposited. The layer of BCB is approximately 2.0 microns thick.

A fourth mask is applied to define the interconnections 21 and 22, followed by an etch which removes portions of the BCB layer. A nickel and gold plating is performed in the aforementioned portions. A fifth mask is applied to define the regions where segments of the BCB layer is removed, exposing regions of the silicon wafer. A dry etch is then used to remove the segments of the BCB layer. A layer of 3-APS adhesion promoter is now applied to the side of the wafer opposite to the side where the fifth mask was deposited, and a 2 micron thick layer of BCB is deposited thereon, defining a backside BCB layer. A sixth mask is disposed on the backside BCB layer and defines regions where the silicon wafer is to be exposed. A dry etch is used to expose the wafer silicon, followed by removal of the silicon from these regions. The backside BCB layer is then removed. The board 14 is made in an analogous manner.

Figure 8:
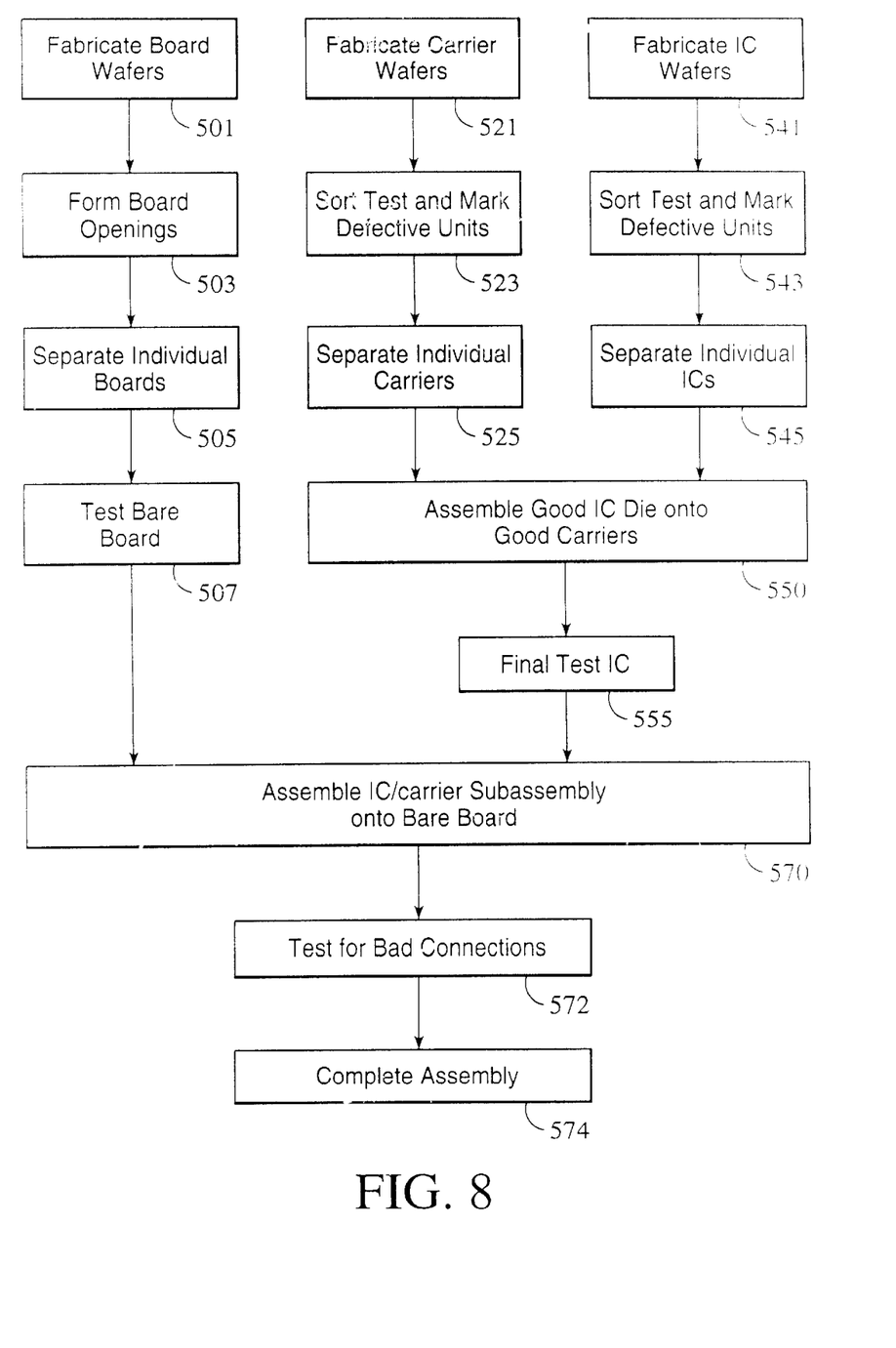
FIG. 8 shows the steps for interconnecting ICs efficiently according to the method of the present invention.

FIG. 8 is a flowchart showing the preferred method of interconnecting ICs according to the present invention. As shown, for each complex IC, the board wafers, the carrier wafers, and the IC wafers are separately manufactured. Referring to step 501, after the board wafers are fabricated, openings are formed in the boards at step 503. The individual boards are separated at step 505, and tested at step 507. The carriers are fabricated at step 521, and are tested and sorted for defective units at step, 523. Defective units are discarded, and the good units are separated into individual carriers at step 525. Referring to steps 541 through 545, the ICs are also tested for defects once they are fabricated. The good units are also sorted from the defective units and are separated into individual ICs. At step 550, the good IC dies are mounted onto corresponding good carriers. After the ICs have been mounted to the carriers, a final test of the IC is conducted at step 555. This additional test before the IC is integrated with other subsystem ICs eliminates the burden of producing "known good die." Since no assumptions are made regarding the quality of the die, compound yield loss is also eliminated. The IC/carrier subassembly is mounted onto the board at step 570. Bad connections are tested for at step 572 and upon passing the test, the assembly is completed at step 574.

Figure 9:
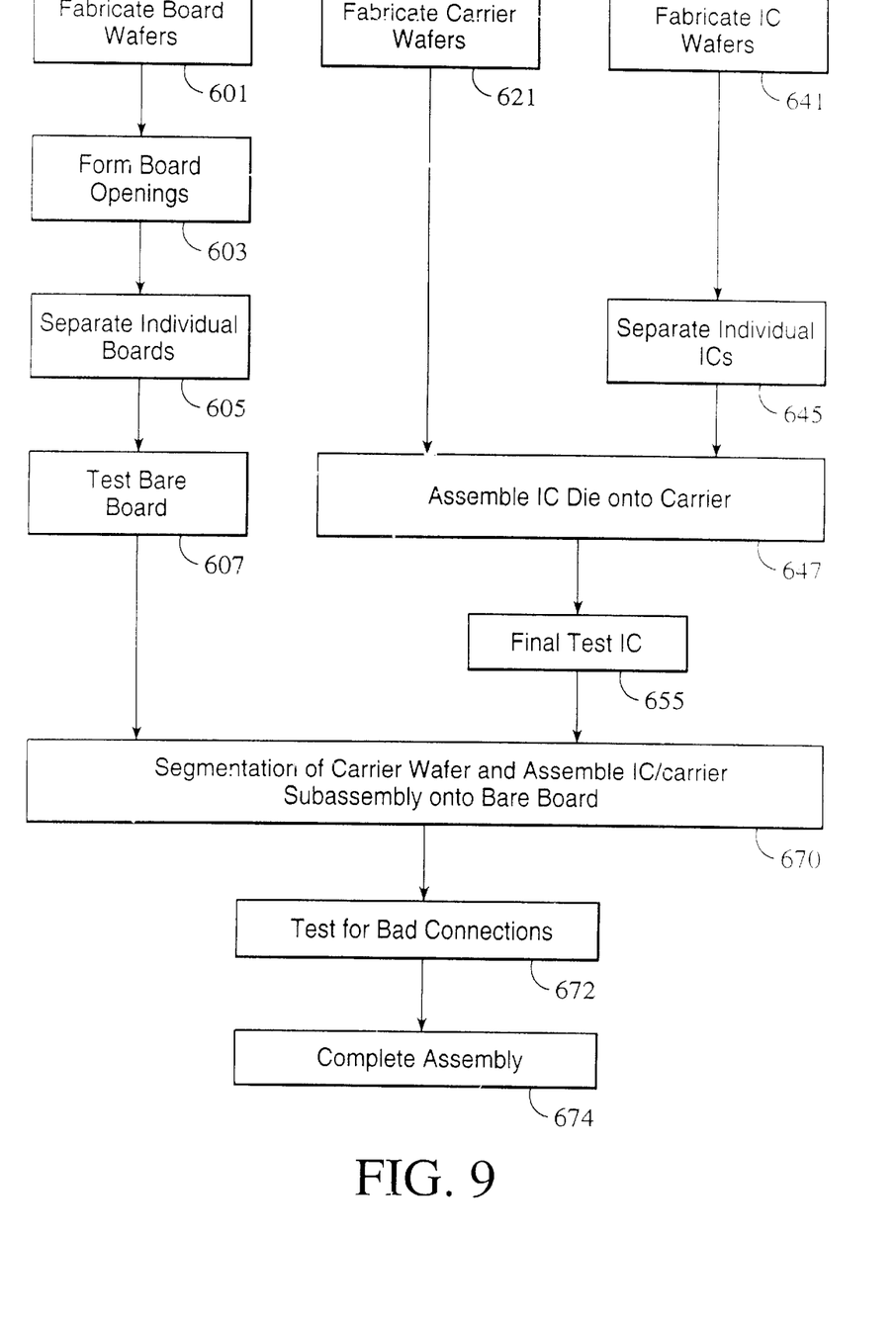
FIG. 9 shows the steps of a method for interconnecting ICs according to an alternate method of the present invention.

Referring to FIGS. 8 and 9, an alternative method of interconnecting ICs according to the present invention is shown. Specifically, steps 601, 603, 605 and 607 correspond to steps 501, 503, 505 and 507, discussed above with respect to FIG. 8. The method shown in FIG. 9, however, differs in that the individual ICs 110 are assembled onto the carriers (not shown) before the carriers are segmented. Specifically, the carrier wafer 112a is fabricated at step 621 so as to have a plurality of spacedapart carrier regions 112 located therein. In a separate process, ICs 110 are fabricated at step 641. Thereafter, the ICs 110 are segmented at step 645 and assembled onto the carrier wafer 112a at step 647, using the solder attach techniques discussed above. In this fashion, each carrier region 112 will have at least one IC 110 associated therewith.

Referring to FIGS. 3, 8, 9 and 10, attachment of the ICs 110 before segmentation of the carriers 12 allows performing 100% functional testing or burn-in of the ICs 110, before final assembly. To that end, the carrier wafer 112a includes a power plane 120 and a ground plane 122, as well as signal paths 124. Each of the carrier regions 112 may be coupled to the power plane 120 and the ground plane 122 through interconnects 126. In this configuration, ICs 110, associated with the carrier regions 112, may be tested before completing assembly at step 670. Specifically, the signal paths 124, the ground and power planes 120 and 122 and the interconnects 126 are in electrical communication with the requisite connections 21 to facilitate biasing and signal transmission to the ICs 110. Thus, early detection of defective ICs 110 may be achieved. The carrier region 112 and IC 110 may be discarded after segmentation, but before final subassembly into a board 14, thereby saving the cost of disposing of a properly functioning board 14. In addition, reduced is the probability that damage to the IC 110 will occur during functional testing, because coupling of the test signals and bias voltages to the ICs 110 occurs at coupling pads 124a and 126a. There is no physical contact with the IC 110 and the testing unit (not shown) during burn-in.

Figure 10:
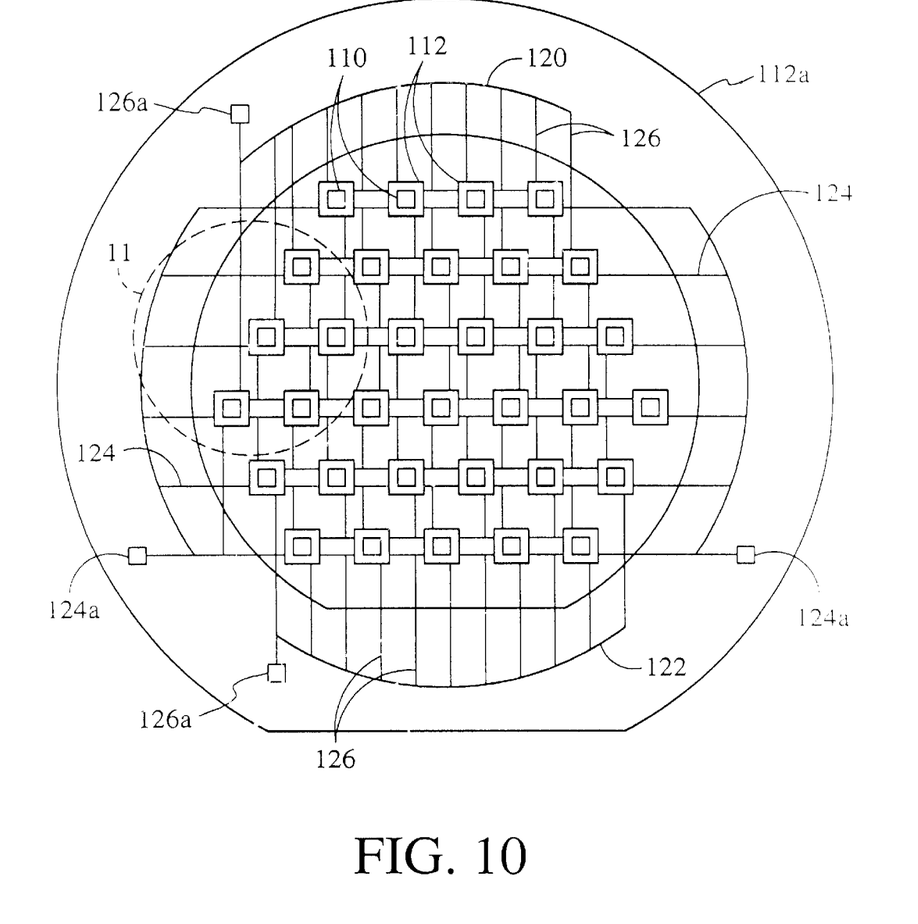
FIG. 10 is a simplified plan view of a carrier wafer in accord to the present invention.
Figure 11:
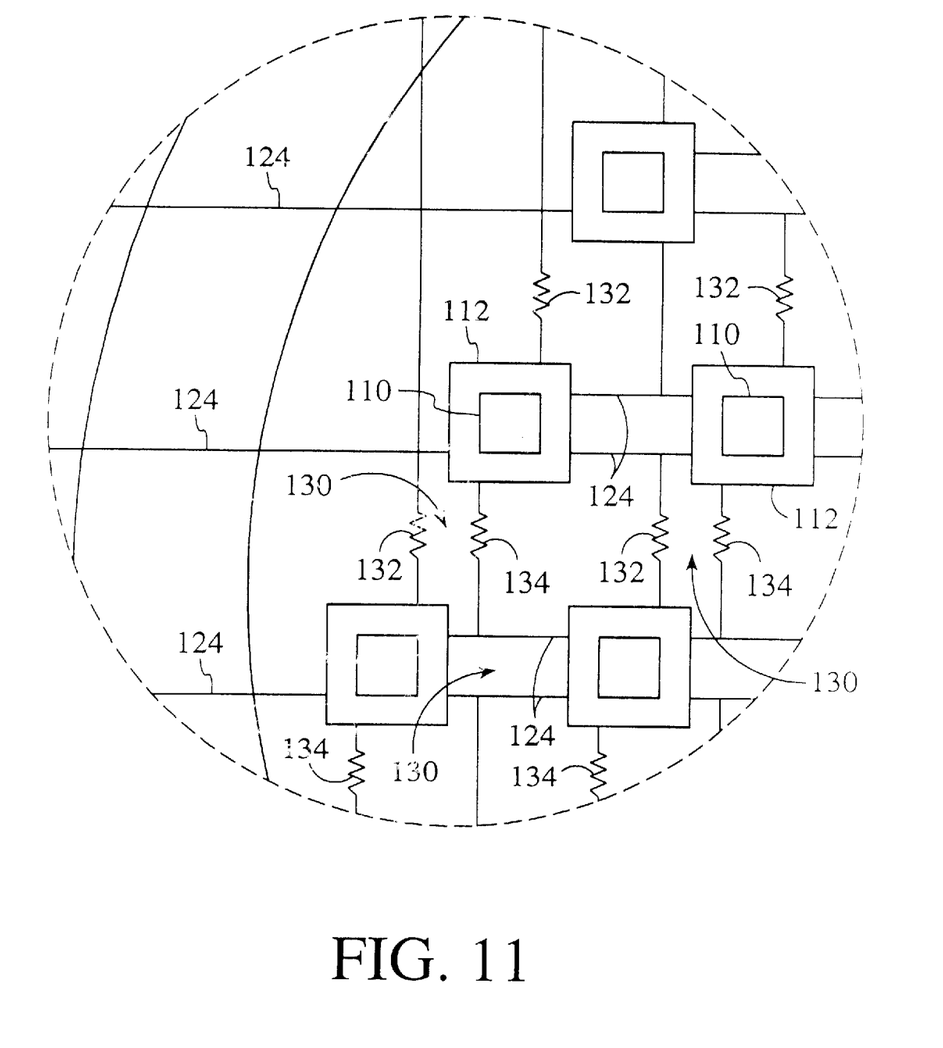
FIG. 11 is a detailed plan view of a portion of the carrier wafer shown in FIG. 10.

Referring to FIGS. 9, 10 and 11, the signal paths 124 and interconnects 126 are routed to each of the carrier regions 112 by passing through test circuitry regions 130, located between adjacent carrier regions 112. Also included in the test circuitry regions 130 are other circuit elements necessary to properly configure the ICs located in the carrier regions 112 for functional testing. For example, isolation resistors 132 and 134 may be disposed therein. In this fashion, each IC 110 may be coupled to the power plane 120 and ground plane 122 via isolation resistors 132 and 134, respectively. This prevents a short association with one of the carrier regions 112, from shorting the entire carrier wafer 112a. During the segmentation step 670, shown in FIG. 9, the test circuit regions 130 and the power and ground planes 120 and 122, shown in FIG. 10, are bisected. This allows segmentation of the carrier wafer 112a without damaging the individual carrier regions 112. Bad connections are tested for at step 672, and upon passing the test, the assembly is completed at step 674, shown in FIG. 10.

What is claimed is:

1. A method for forming a mount for an integrated circuit comprising:

manufacturing a routing carrier having a power plane, a conductive bond pad spaced-apart from said power plane and an insulative body disposed therebetween;

forming a via in said insulative body extending between said power plane and said conductive bond pad; and depositing a metallic contact within said via to extend between said conductive bond pad and said power plane, with said bond pad and said metallic contact having circular cross-sections with a ratio of the diameter of said bond pad to the diameter of said metallic contact being in a predetermined range, wherein said predetermined range is from 2:1 to 5:4, inclusive.

2. The method as recited in claim 1 wherein forming a via further includes electroplating a cube of solder onto said bond pad.

3. The method as recited in claim 1 wherein said metallic contact is formed from copper.

4. A method for forming a mount for an integrated circuit, said mount including an insulative body having a conductive trace embedded therein, with said method comprising:

forming a via in said insulative body extending from a surface of said insulative body to said conductive trace;

disposing a metallic contact within said via;

forming a conductive bond pad adjacent to said metallic contact; and reducing stresses on said metallic contact attributable to temperature changes in said bond pad, wherein reducing stresses includes providing said metallic contact and said bond pad with a diameter to define a ratio of said diameter of said bond pad to said diameter of said metallic contact in the range of 2:1 to 5:4.

5. The method as recited in claim 4 further including electroplating a hemispherically-shaped solder bump onto said bond pad.

6. The method as recited in claim 4 wherein reducing stresses further includes depositing a cubical shaped body of solder on said bond pad and thermally reflowing said body to form a hemispherically shaped ball of solder having a diameter associated therewith that is coextensive with the diameter of said bond pad.

7. The method as recited in claim 4 further including embedding an electronic circuit within said insulative body that is in electrical communication with said bond pad.

8. The method as recited in claim 4 further including providing an insulative member having a plurality of signal traces and a plurality of bond sites disposed thereon, with said plurality of bond sites enclosing a region of said insulative member, with a subset of said plurality of signal traces being associated with said plurality of bond sites so that each of said signal traces of said subset extends from one of said plurality of bond sites, away from said region, defining an electrically nonconductive area, with a subset of said plurality of bond sites superimposing one of a plurality of additional bond pads on said insulative body and in electrical communication therewith.

9. The method as recited in claim 8 further including disposing on said surface of said insulative body a plurality of additional conductive traces to extend from said plurality of additional bond pads, with a subgroup of said plurality of additional conductive traces superimposing said nonconductive area.

10. The method as recited in claim 9 further including connecting an integrated circuit to a subset of said plurality of additional bond pads, with said integrated circuit being positioned so as to superimpose said nonconductive area.

11. The method as recited in claim 9 further including forming an aperture in said non-conductive area, with said aperture having a cross-sectional area that exceeds a cross-sectional area of said integrated circuit.

12. The method as recited in claim 4 further including forming a plurality of additional vias each of which extends from said one surface to said conductive trace and disposing a metallic contact in each of said additional vias, defining a plurality of additional vias, and disposing a plurality of additional bond pads on said insulative body, with each of said plurality of additional vias having one of said plurality of additional bond pads in electrical contact therewith, with reducing stresses on said metallic contact further including reducing stresses on each of said plurality of additional metallic contacts attributable to temperature changes in said one of said plurality of additional bond pads.

13. The method as recited in claim 12 where reducing said stresses in each of said plurality of additional metallic contacts includes providing each of said plurality of additional metallic contacts and said one of said plurality of additional bond pads with a diameter, with a ratio of the diameter of said one of said plurality of bond pads to said diameter of each of said plurality of additional metallic contacts being in the range of 2:1 to 5:4.

14. A method for forming a mount for an integrated circuit, said mount including an insulative body having a conductive trace embedded therein, with said method comprising:

forming a plurality of vias in said insulative body extending from a surface of said insulative body to said conductive trace;

disposing a metallic contact within a subset of said plurality of vias;

forming a conductive bond pad adjacent to each of the metallic contacts of said subset, defining a plurality of bond pads; and reducing stresses on each of the metallic contacts of said subset attributable to temperature changes in said bond pad by providing said metallic contact and said bond pad with a diameter to define a ratio of said diameter of said bond pad to said diameter of said metallic contact in a range of 2:1 to 5:4.

15. The method as recited in claim 14 wherein reducing stresses further includes depositing a cubical shaped body of solder on said bond pad and thermally reflowing said body to form a hemispherically shaped ball of solder having a diameter associated therewith that is coextensive with the diameter of said bond pad.

16. The method as recited in claim 15 further including embedding an electronic circuit within said insulative body that is in electrical communication with a subset of said plurality of bond pads.

17. The method as recited in claim 16 further including providing an insulative member having a plurality of signal traces and a plurality of bond sites disposed thereon, with said plurality of bond sites enclosing a region of said insulative member, with a subset of said plurality of signal traces being associated with said plurality of bond sites so that each of said signal traces of said subset extends from one of said plurality of bond sites, away from said region, defining an electrically nonconductive area, with a subset of said plurality of bond sites superimposing one of a plurality of bond pads on said insulative body and in electrical communication therewith.

18. The method as recited in claim 17 further including disposing on said surface of said insulative body a plurality of additional conductive traces to extend from said plurality of bond pads, with a subgroup of said plurality of additional conductive traces superimposing said nonconductive area.

19. The method as recited in claim 18 further including connecting an integrated circuit to a subset of said plurality of bond pads, with said integrated circuit being positioned so as to superimpose said nonconductive area.

20. The method as recited in claim 19 further including forming an aperture in said non-conductive area, with said aperture having a cross-sectional area that exceeds a cross-sectional area of said integrated circuit.

* * * * *